(12) United States Patent
Chudy et al.

(10) Patent No.: US 7,504,654 B1
(45) Date of Patent: Mar. 17, 2009

(54) STRUCTURE FOR LOGICAL "OR" USING BALLISTICS TRANSISTOR TECHNOLOGY

(75) Inventors: David Daniel Chudy, Raleigh, NC (US); Michael G. Lisanke, Durham, NC (US); James Gordon McLean, Furquay-Varina, NC (US); Cristian Medina, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/182,039

(22) Filed: Jul. 29, 2008

(51) Int. Cl.
*H01L 29/08* (2006.01)
(52) U.S. Cl. ........................................ 257/29
(58) Field of Classification Search ............. 257/24–29, 257/E29.02; 326/102; 438/283
See application file for complete search history.

(56) References Cited

U.S. PATENT DOCUMENTS

| 4,962,341 | A | | 10/1990 | Schoeff |
| 5,289,077 | A | * | 2/1994 | Ugajin ........................ 313/308 |
| 5,362,972 | A | | 11/1994 | Yazawa et al. |
| 6,097,036 | A | * | 8/2000 | Teshima et al. ............... 257/26 |
| 6,713,327 | B2 | | 3/2004 | Leedy |
| 2007/0241399 | A1 | * | 10/2007 | Irisawa et al. ............... 257/347 |
| 2008/0136454 | A1 | | 6/2008 | Diduck et al. |

* cited by examiner

*Primary Examiner*—Nathan W Ha
(74) *Attorney, Agent, or Firm*—Shimokaji & Associates, PC

(57) ABSTRACT

A ballistic logic gate is disclosed. The ballistic logic gate may include an etched silicon substrate with a pair of etched silicon triangular baffles defining input channels. An electron may travel through the input channels toward a nano-deflector with a parabolic deflection surface. The parabolic deflection surface may guide electrons into a fixed path of an output channel toward an output terminal for performing a logic function.

1 Claim, 1 Drawing Sheet

STRUCTURE FOR LOGICAL "OR" USING BALLISTICS TRANSISTOR TECHNOLOGY

BACKGROUND OF THE INVENTION

The present invention generally relates to high frequency semiconductor devices and more particularly to logic gates which utilize ballistic electron phenomena.

Some in the art have sought to design logic gates for manufacture in smaller packages yet capable of producing faster computing power. For example, some have turned to using transistors in logic gates for performing logical operations in a digital circuit. As transistors become both smaller and more powerful, some researchers have sought solutions to deal with the inherent problems that come with the small sizes demanded by some of today's applications. As researchers continue to scale down the sizes and ramp up the speed of electrical components, heat generation and electrical leaking become larger and larger problems.

Some transistors may be designed to actively control the flow of electrons. It is known to manufacture transistors by forming a sandwich of two materials; the center material is controlled via current/voltage so as to either permit electrons to flow across the sandwich, or to halt their flow across the sandwich. It is the starting and stopping of electrons that causes great amounts of energy, typically in the form of heat, to be released.

A prior art transistor may register a "one" as a collection of electrons on a capacitor, and a "zero" when those electrons are removed. One drawback to this method is that it takes time move the electrons on and off the capacitor (refill time) limiting the speed of the transistor and the output for the circuit. A second drawback is that these prior art transistors may produce immense amounts of heat when that energy is emptied.

It is known in the art to form logic gates by chaining transistors together. However, such designs may suffer from undesirable heating and leakage problems. Additionally, some chained transistor designs amplify the drawbacks of single transistors and may provide undesirably slow operating performance in unnecessarily large packaging.

As can be seen, there is a need for a high frequency logic gate using ballistic phenomena.

SUMMARY OF THE INVENTION

In one aspect of the present invention, a ballistic logic gate comprises, a silicon etched substrate frame including first, second, third, and fourth frame sides wherein the first and second frame sides intersect at a common corner of the frame; a pair of triangular silicon baffles etched from the silicon substrate frame wherein, the pair of baffles are spaced from the first and second frame sides to define first and second inputs and first and second input channels leading from respective first and second inputs and intersecting at the common corner of the frame, the pair of baffles are disposed against the third and fourth frame sides and spaced from one another to define an output channel therebetween and an output opposite the common corner of the frame wherein the output channel traverses between the pair of baffles from the common corner to the output; an output terminal disposed beyond the output for indicating a logical "OR" operation; a nano-deflector disposed in the common corner; and a parabolic nano-deflection surface on the nano-deflector for receiving an oncoming electron entering the silicon etched substrate frame through either the first or second inputs and for deflecting the electron into a fixed path within the output channel and toward the output terminal.

These and other features, aspects and advantages of the present invention will become better understood with reference to the following drawings, description and claims.

DETAILED DESCRIPTION OF THE INVENTION

Figure 1:
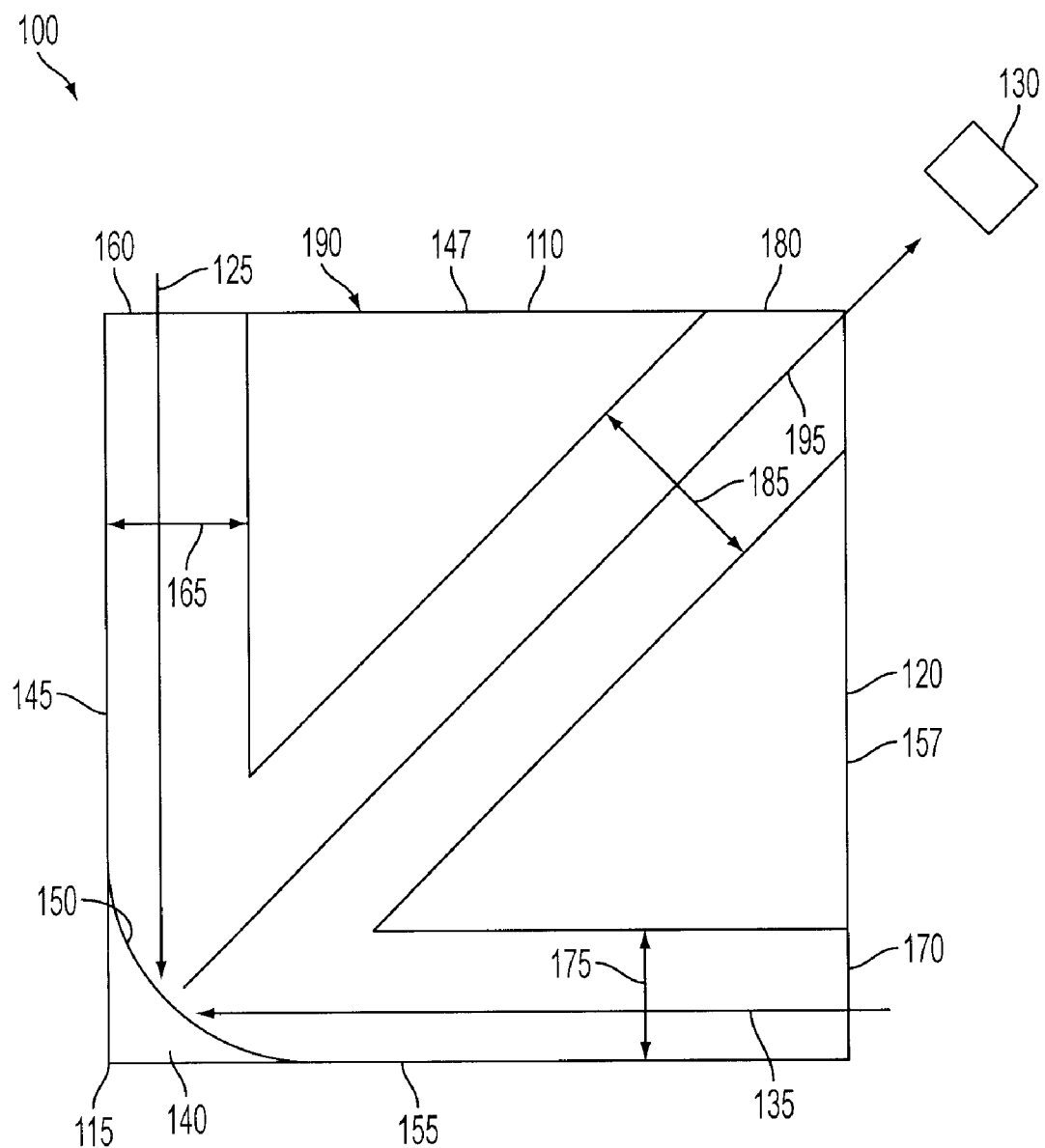
FIG. 1 is a schematic illustrating a ballistics logic gate according to one exemplary embodiment of the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

Referring to FIG. 1, a ballistic logic gate 100 may be formed in a silicon etched substrate frame 190 including two silicon baffles 110 and 120. The baffles 110 and 120 may be formed triangularly and etched within the substrate frame spaced from frame sides 145 and 155 respectively to define a first input 160 and first input channel 165 and a second input 170 and second channel input 175. The first input channel 165 and second input channel 175 may intersect at a common corner 115 defined by the intersection of frame side 145 and frame side 155. The baffles 110 and 120 may also be positioned against frame sides 147 and 157 respectively and spaced from one another to define an output channel 185 leading to an output 180 positioned opposite the common corner 115. A nano-deflector 140 including a parabolic nano-deflection surface 150 may be positioned in the common corner 115. The parabolic nano-deflection surface 150 may be oriented to face the output channel 185. The ballistic gate 100 may also include an output terminal 130 disposed beyond the output 180.

In operation, the ballistic logic gate 100 may be used to perform a logic function such as the logical OR between two input signals. In one exemplary embodiment, an electron representing an input signal may flow into either the first input channel 165 or second input channel 175 traveling along either a trajectory path 125 or trajectory path 135, respectively. It will be understood that an electron entering through either one of inputs 160 or 170 may not necessarily enter the input channels 165 or 175 parallel to the frame sides 145 and 155 along trajectories 125 or 135 as shown and may, in some cases, enter in at slightly more acute or obtuse trajectories relative to the common corner 115. Yet, the electron may encounter the parabolic nano-deflection surface 150 where the nano-deflection surface 150 may counter the directional momentum of the electron and may deflect the electron into the output channel 185. The deflection of the electron by the parabolic nano-deflection surface 150 may then project the electron along the fixed path 195, through the output channel 185, and out output 180. Thus, in other words, the signal provided by a deflected electron flowing out of output channel 185 and registering at output terminal 130 may, in one exemplary embodiment, be the logical "OR" between the input signals emanating from the electron sources sending electrons through the inputs 160 or 170.

It will be understood by those skilled in the art that while the foregoing was described in the context of certain exemplary embodiments, that the present invention may be modified to operate in a number of ways. For example, while some of the previously described embodiments described a specific logic function, it will be understood that these were illustrative and that output terminal may represent a logical operation as required by the application. Additionally, it will be understood that while the foregoing has been described in a single logic gate embodiment with an output terminals at a single output, that the logic gate of the present invention may also be employed in a chain or series of logic gate structures for which the output terminals may not be physically required. For example, the output of one logic gate may lead into an entrance of another logic gate for creating a branching of logic signals within a labyrinth of logic gates.

It should be understood, of course, that the foregoing relates to exemplary embodiments of the invention and that modifications may be made without departing from the spirit and scope of the invention as set forth in the following claims.

We claim:

1. A ballistic logic gate, comprising:
   a silicon etched substrate frame including first, second, third, and fourth frame sides wherein the first and second frame sides intersect at a common corner of the frame;
   a pair of triangular silicon baffles etched from the silicon substrate frame wherein,
   the pair of baffles are spaced from the first and second frame sides to define first and second inputs and first and second input channels leading from respective first and second inputs and intersecting at the common corner of the frame,
   the pair of baffles are disposed against the third and fourth frame sides and spaced from one another to define an output channel there between and an output opposite the common corner of the frame wherein the output channel traverses between the pair of baffles from the common corner to the output;
   an output terminal disposed beyond the output for indicating a logical "OR" operation;
   a nano-deflector disposed in the common corner; and
   a parabolic nano-deflection surface on the nano-deflector for receiving an oncoming electron entering the silicon etched substrate frame through either the first or second inputs and for deflecting the electron into a fixed path within the output channel and toward the output terminal.

* * * * *